(12) United States Patent
Scholz et al.

(10) Patent No.: US 8,873,023 B2
(45) Date of Patent: Oct. 28, 2014

(54) ILLUMINATION SYSTEM FOR MICROLITHOGRAPHY

(75) Inventors: Axel Scholz, Aalen (DE); Frank Schlesener, Oberkochen (DE); Nils Haverkamp, Aalen (DE); Vladimir Davydenko, Bad Herrenalb (DE); Michael Gerhard, Aalen (DE); Gerhard-Wilhelm Ziegler, Aalen (DE); Mirco Kern, Bobingen a.d.R (DE); Thomas Bischoff, Koenigsbronn (DE); Thomas Stammler, Aalen (DE); Stephan Kellner, Westhausen (DE); Manfred Maul, Aalen (DE); Daniel Walldorf, Frankfurt (DE); Igor Hurevich, Saarbruecken (DE); Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 709 days.

(21) Appl. No.: 13/186,068

(22) Filed: Jul. 19, 2011

(65) Prior Publication Data

US 2012/0019796 A1  Jan. 26, 2012

Related U.S. Application Data

(63) Continuation of application No. PCT/EP2010/000411, filed on Jan. 25, 2010.

(30) Foreign Application Priority Data

Jan. 29, 2009 (DE) .......................... 10 2009 006 685

(51) Int. Cl.
*G03B 27/54* (2006.01)
*G03B 27/42* (2006.01)
*G03F 7/20* (2006.01)

(52) U.S. Cl.
CPC ........ *G03F 7/70191* (2013.01); *G03F 7/70083* (2013.01); *G03F 7/70075* (2013.01)
USPC .............................................. 355/67; 355/53

(58) Field of Classification Search
CPC .................................................... G03F 7/0075
USPC ................................... 355/52, 53, 55, 67–71
See application file for complete search history.

(56) References Cited

U.S. PATENT DOCUMENTS

| | | | |
|---|---|---|---|
| 5,098,184 A | 3/1992 | Van den Brandt et al. | |
| 5,237,367 A | 8/1993 | Kudo | |
| 5,251,067 A | 10/1993 | Kamon | |
| 5,252,067 A | 10/1993 | Kakimoto | |
| 5,963,305 A | 10/1999 | Mizouchi | |
| 7,126,137 B2 * | 10/2006 | Singer et al. ................ | 250/492.1 |
| 8,705,005 B2 * | 4/2014 | Deguenther et al. ............ | 355/67 |
| 2003/0038225 A1 | 2/2003 | Mulder et al. | |
| 2006/0221453 A1 | 10/2006 | Koehler et al. | |
| 2007/0146853 A1 | 6/2007 | Singer et al. | |
| 2007/0279535 A1 | 12/2007 | Fiolka | |
| 2009/0021715 A1 | 1/2009 | Deguenther et al. | |

FOREIGN PATENT DOCUMENTS

| | | |
|---|---|---|
| DE | 103 44 010 A1 | 4/2005 |
| EP | 0 844 530 A2 | 5/1998 |
| EP | 1 521 111 A | 4/2005 |
| JP | 04-305601 | 10/1992 |
| JP | 2003-022967 | 1/2003 |
| JP | 2007-506262 | 3/2007 |
| JP | 2007-150295 | 6/2007 |
| JP | 2007-524248 | 8/2007 |
| JP | 2008-182244 | 8/2008 |
| JP | 2009-527113 | 7/2009 |
| WO | WO 2005/026822 | 3/2005 |
| WO | WO 2007/093 433 | 8/2007 |
| WO | WO 2007/093396 | 8/2007 |
| WO | WO 2008/101656 | 8/2008 |

OTHER PUBLICATIONS

English translation and Japanese office action for Japanese patent application No. JP 2011-546698, dated Mar. 8, 2013.
The English translation of the Germany Examination report corresponding to DE Appl No. 10 2009 006 685.3, dated Dec. 10, 2009.

The International Search Report for the corresponding PCT Application No. PCT/EP2010/000411, mailed Apr. 20, 2010.

* cited by examiner

*Primary Examiner* — Hung Henry Nguyen
(74) *Attorney, Agent, or Firm* — Fish & Richardson P.C.

(57) ABSTRACT

An illumination system for microlithography serves to illuminate an illumination field with illumination light of a primary light source. A first raster arrangement has bundle-forming first raster elements which are arranged in a first plane of the illumination system or adjacent to the plane. The first raster arrangement serves to generate a raster arrangement of secondary light sources. A transmission optics serves for superimposed transmission of the illumination light of the secondary light sources into the illumination field. The transmission optics has a second raster arrangement with bundle-forming second raster elements. In each case one of the raster elements of the first raster arrangement is allocated to one of the raster elements of the second raster arrangement for guiding a partial bundle of an entire bundle of illumination light. The first raster arrangement for example has at least two types (I, II, III) of the first raster elements which have different bundle-influencing effects. The raster elements of the two raster arrangements are arranged relative to one another in such a way that to each raster element type (I to III) is allocated at least one individual distance ($\Delta_I$, $\Delta_{II}$, $\Delta_{III}$) between the first raster element of this type (I to III) and the allocated second raster element of the second raster arrangement. As a result, an illumination system is obtained which allows particular illumination parameters to be influenced in such a way that undesirable influences on other illumination parameters are avoided to the greatest extent possible.

12 Claims, 11 Drawing Sheets ns system for illuminating an illumination field with illumination light. The disclosure further relates to a raster arrangement for use in an illumination system of this type, a microlithographic projection exposure apparatus including an illumination system of this type, a microlithographic production method for microstructured or nanostructured components and a component which has been produced according to a method of this type.

ILLUMINATION SYSTEM FOR MICROLITHOGRAPHY

CROSS-REFERENCE TO RELATED APPLICATIONS

This application is a continuation of, and claims benefit under 35 USC 120 to, international application PCT/EP2010/000411, filed Jan. 25, 2010, which claims benefit of German Application No. 10 2009 006 685.3, filed Jan. 29, 2009. International application PCT/EP2010/000411 is hereby incorporated by reference in its entirety.

FIELD

The disclosure relates to an illumination system for microlithography for illuminating an illumination field with illumination light. The disclosure further relates to a raster arrangement for use in an illumination system of this type, a microlithographic projection exposure apparatus including an illumination system of this type, a microlithographic production method for microstructured or nanostructured components and a component which has been produced according to a method of this type.

BACKGROUND

An illumination system for microlithography is known from WO 2007/093433 A1.

SUMMARY

The disclosure provides an illumination system for microlithography with which influencing particular illumination parameters of the illumination of the illumination field or object field is possible so that undesirable influences on other illumination parameters are avoided to the greatest extent possible.

In one aspect, the disclosure provides an illumination system for microlithography for illuminating an object field with illumination light of a primary light source, wherein the illumination system includes a first raster arrangement with bundle-forming first raster elements which are arranged in a first plane of the illumination system or adjacent to the plane for generating a raster arrangement of secondary light sources. The illumination system also includes a transmission optics for superimposing transmission of the illumination light of the secondary light sources into the illumination field. The transmission optics include a second raster arrangement with bundle-forming second raster elements. In each case one of the raster elements of the first raster arrangement being allocated to one of the raster elements of the second raster arrangement for guiding a partial bundle of an entire bundle of the illumination light. At least one of the two raster arrangements includes at least two types of the raster elements which have different bundle-influencing effects. The raster elements of the two raster arrangements are allocated to one another in such a way that to each raster element of one of the raster element types of one of the raster arrangements is allocated at least one individual free distance between the raster element of this type and the allocated raster element of the other raster arrangement.

It has been found according to the disclosure that a distance-type allocation between raster elements of the raster arrangements of the illumination system allows different collecting effects exerted on the allocated partial bundles by the different types of the first raster elements of the first raster arrangements to be compensated for partially or entirely. In such a case, other effect differences between the individual raster element types which influence the partial bundles of the illumination light, in particular higher order effects, can be utilized to such an extent that the often inevitable different collecting effects of the different types of first raster elements can be neglected. If refractive raster elements are used, it is for example possible to compensate for unwanted effects exerted by different lens radii of the raster elements, thus allowing other shape contributions, for example higher order shape contributions, to be utilized for compensation of particular illumination parameters when using aspheric lens shapes. An illumination system according to the disclosure allows particular illumination parameters to be either corrected or pre-compensated for. For example, when using different types of raster elements in at least one of the raster arrangements, an ellipticity correction may be performed in such a way that undesirable influences on an intensity distribution from the different illumination directions are avoided. Reflective raster elements can be used as well. In such a case, the difference between different types of raster elements is not due to a different refractive effect of the raster elements but is caused by a different reflective effect thereof. Tilted lenses are suitable for use as raster elements as well. The raster elements may be monolithic, in other words they may be formed in one piece, in such a way that a raster arrangement is produced from a monolithic lens or substrate block. Alternatively, it is conceivable to use raster elements consisting of multiple parts; one of these parts may be a group of raster elements or even an individual raster element. A variation of the individual distance between the raster element of a particular type of one of the raster arrangements and the allocated raster element of the other raster arrangement may have the shape of the graph of a strictly monotonic function which describes the variation of distances across the bundle-guiding cross-section of the raster arrangements. Alternatively, this function may have a maximum or a minimum in the bundle-guiding cross-section. In other words, the distance variation across the cross-section may in particular have the shape of the graph of a random curve having at least one apex. Generally speaking, each of the two raster arrangements may also be provided with one type of raster elements only; a distance variation across the bundle-guiding cross-section of the raster arrangements may then be implemented in the manner of the functions or stages described above or below. The illumination system may be equipped with a primary light source; this is however not obligatory. It is conceivable as well to prepare the illumination system for later use with a primary light source which is separate from the illumination system. The free distance between the raster elements of the two raster arrangements is formed by an air gap, in other words an intermediate space which contains no solids. The two raster arrangements may be components which are separate from each other. The raster arrangement which includes at least two types of raster elements which have different bundle-influencing effects may be the first raster arrangement, the second raster arrangement or both raster arrangements.

At least one distance step between a first raster area including at least one raster element of the first raster element type and a second raster area including at least one raster element of the second raster element type is a discrete implementation of the distance allocation according to the disclosure. A distance step of this type can already be provided in a blank used for the production of the raster arrangement.

A type allocation of the raster elements to the raster areas ensures a reproducible production and a reproducible design of the illumination system. The raster areas may in each case include raster elements of the same type.

Raster arrangements with distance steps which are designed in such a way that the largest thickness is either in the center of the raster element and reduces gradually towards the edge or that the smallest thickness is in the center of the raster element and increases gradually towards the edge provide corresponding compensatory effects depending on the type allocation of the raster elements relative to the center and to the edge.

The advantages of the distance allocation are particularly apparent in a design of the raster elements as aspheric raster elements, with each of the individual raster element types having a different conical constant.

A desired influence on particular illumination parameters can be achieved viavia several conical constants of the various types of first raster elements. Alternatively or additionally, the bundle-influencing surfaces of the different types of raster elements may have different radii of curvature which may be compensated for to a desired extent via the distance-type allocation. In other words, a spherical design of the raster elements is conceivable as well, with the different types having different radii of curvature. The different conical constants allow a controlled intensity variation to be provided across the illumination field for correction, compensation or precompensation purposes. Alternatively or additionally, a desired influence on particular illumination parameters may be achieved via different radii or, more generally speaking, via differently designed non-rotationally symmetric freeform surfaces of the various types of first raster elements.

In a second aspect, the disclosure provides an illumination system for microlithography for illumination of an object field with illumination light of a primary light source, wherein the illumination system includes a first raster arrangement with bundle-forming first raster elements which are arranged in a first plane of the illumination system or adjacent to the plane for generating a raster arrangement of secondary light sources. The illumination system also includes a transmission optics for superimposing transmission of the illumination light of the secondary light sources into the illumination field. The transmission optics includes a second raster arrangement with bundle-forming second raster elements, and a displacement device for displacing at least one segment of the first raster arrangement relative to the second raster arrangement.

The displacement device according to the disclosure may be configured for displacement of the at least one segment of the first raster arrangement relative to the second raster arrangement essentially along a beam direction of the illumination light and/or essentially transverse to a beam direction of the illumination light and/or for pivoting one of the raster arrangements relative to the other raster arrangements. When the two raster arrangements are displaced relative to each other, the first raster arrangements can be displaced, the second raster arrangement can be displaced or both raster arrangements can be displaced. The segment which is displaceable via the displacement device may include exactly one of the raster elements, a group of several raster elements, in particular a raster row, a raster column or a defined raster area, may include several groups of raster elements or may include all raster elements, in other words the entire raster arrangement. The illumination system according to the first aspect including the displacement device may be combined with the illumination system according to the second aspect including the at least two types of raster elements which have different bundle-guiding effects. In other words, all features of the disclosure described above can be combined with one another.

A displacement device which is designed in such a way that a periodic displacement of at least one segment of the first raster arrangement relative to the second raster arrangement takes place at a period which is small compared to an exposure time of the illumination field during lithographic projection exposure may be utilized to take advantage of an averaging effect via the illumination parameter(s) to be predetermined.

A design of the illumination system including a measuring device for detecting an illumination intensity distribution of the illumination light and a control device which is in a signal connection with the measuring device and the displacement device allows a feedback, in other words an actuation of the displacement device to be performed depending on the measuring result of the measuring device. A feedback of this type is also referred to as online feedback loop. The measuring device is able to detect the illumination intensity distribution in the field plane of the illumination field or in a plane which is conjugated thereto and/or in a pupil plane of the illumination system or in a plane which is conjugated thereto. Detecting the illumination intensity distribution in a plane of the illumination system which is disposed between a field plane and a pupil plane is conceivable as well. In this regard, a pupil plane is a plane in which an intensity distribution of the illumination light is a measure for an illumination angle distribution of the illumination of the illumination field.

The disclosure also provides a production method for microstructured components. The method includes providing a substrate which is at least partially provided with a layer of a light-sensitive material; providing a reticle which is provided with structures to be imaged; providing a projection exposure apparatus including an illumination system according to the disclosure, with the structures to the imaged being arranged in the illumination field; and projecting at least a part of the reticle onto a region of the layer via the projection exposure apparatus.

The disclosure further provides a microstructured or nanostructured component produced by such a method.

BRIEF DESCRIPTION OF THE DRAWINGS

Embodiments of the disclosure will hereinafter be explained in more detail via the drawings in which.

DETAILED DESCRIPTION

Figure 1:
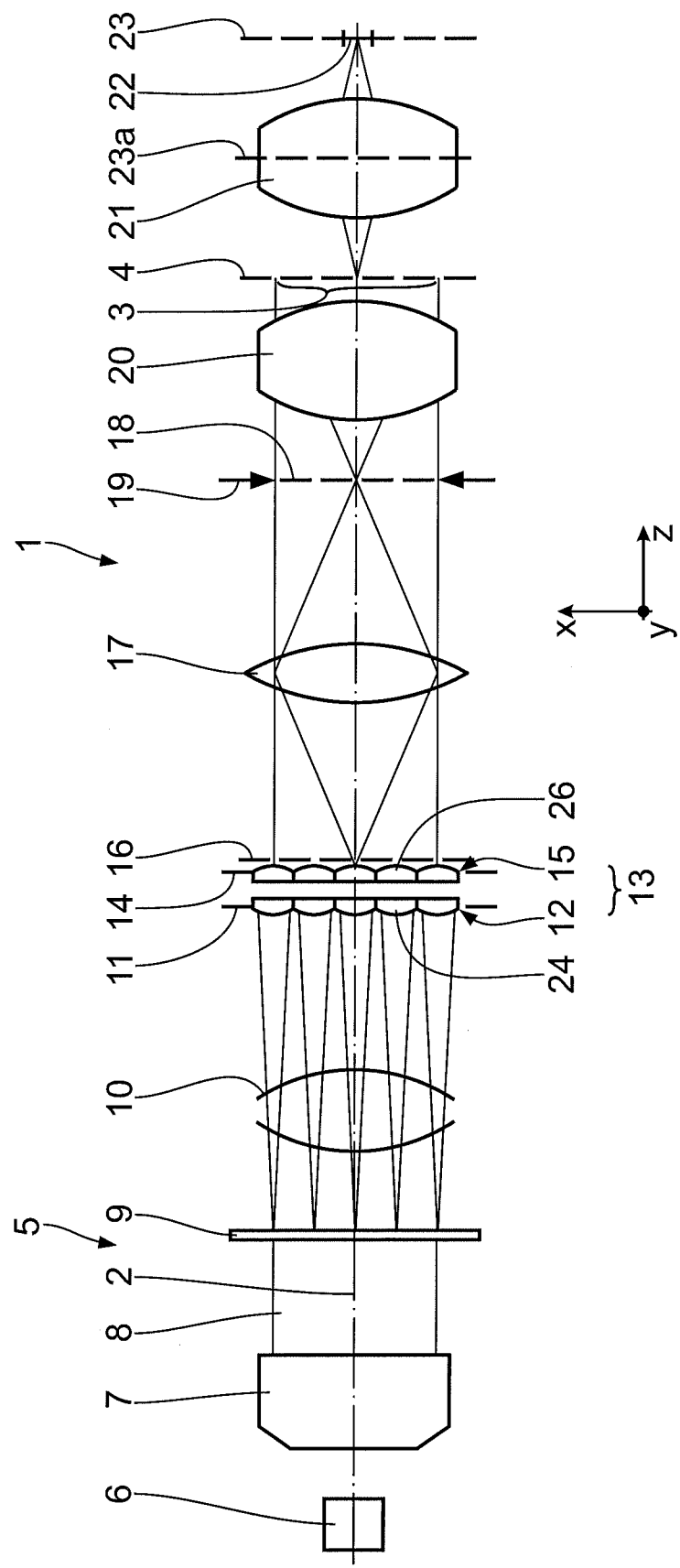
FIG. 1 is a schematic meridional section through an illumination system according to the disclosure in a microlithographic projection exposure apparatus including a raster module with a two-step raster arrangement which is shown schematically and is not according to the disclosure.

FIG. 1 is a schematic illustration of a microlithographic projection exposure apparatus 1 which is a wafer scanner and is used for the production of semiconductor components and other finely structured components. In order to obtain resolutions of up to fractures of micrometers, the projection exposure apparatus 1 uses in particular deep ultraviolet light (VUV).

In order to facilitate the description of positional relationships, a Cartesian x-y-z coordinate system is used for the following description. The x-axis runs upward in FIG. 1. The y-axis is perpendicular to the drawing plane of FIG. 1 and runs towards the observer. The z-direction runs to the right in FIG. 1. A scanning direction of the projection exposure apparatus 1 coincides with the y-direction. In the meridional section according to FIG. 1, all optical components of the projection exposure apparatus 1 are arranged in a row along an optical axis 2. The optical axis 2 may of course also be randomly folded, in particular to obtain a compactly designed projection exposure apparatus 1.

An illumination system of the projection exposure apparatus 1, the entirety of which is designated by the reference numeral 5, serves to achieve a defined illumination of an object field or illumination field 3 in a reticle plane 4 in which a structure in the form of a reticle is arranged, which structure (not shown in more detail) is to be transmitted by projection exposure. The object field 3 and the illumination field may coincide with each other. As a rule, the object field 3 is disposed in the illumination field. An $F_2$-laser with a working wavelength of 157 nm serves as primary light source 6 whose illumination light beam is coaxial with the optical axis 2. Other DUV or UV light sources such as an ArF excimer laser with a working wavelength of 193 nm, a KrF excimer laser with a working wavelength of 248 nm and other primary light sources with higher or lower working wavelengths are conceivable as well.

In order to facilitate the description, components of an illumination optical system of the illumination system 5 are represented as refractive optical components. Alternatively or additionally, these components may also be replaced or supplemented by reflective components, in other words mirrors. Instead of the essentially dioptric system according to FIG. 1, it is therefore conceivable as well to use a catadioptric system or a catoptric system. A reflective design of the illumination system 5 may in particular be used if the primary light source 6 is an EUV light source which generates useful light with a wavelength in the range of between 5 nm and 30 nm, in particular in the range of 13.5 nm.

The first component on which the light beam 6, which has a small rectangular cross-section, impinges after being emitted by the light source 6 is a beam expansion optical system 7 which generates an output beam 8 with essentially parallel light and a larger rectangular cross-section. The illumination light beam 8 has an x/y aspect ratio which may be in the range of 1 or may even be greater than 1. The beam expansion optical system 7 may include elements for coherence reduction of the illumination light 8. Having been essentially parallelized by the beam expansion optical system 7, the illumination light 8 then impinges on a diffractive optical element (DOE) 9 which is a computer-generated hologram (CGH) for generating an illumination light angular distribution. When passing through a Fourier lens arrangement, in other words a condenser 10 which is shown in a highly schematic illustration and which is located at a position relative to the DOE 9 that corresponds to its focal width, the angular distribution of the illumination light 8 generated by the DOE 9 is converted into a illumination light intensity distribution which is two-dimensional, in other words position-dependent in a direction perpendicular to the optical axis 2. The intensity distribution thus generated is therefore present in a first illumination plane 11 of the illumination system 5. Together with the condenser 10, the DOE 9 therefore forms a light distribution device for generating a two-dimensional illumination light intensity distribution. This light distribution device is also referred to as pupil defining element (PDE).

Figure 2:
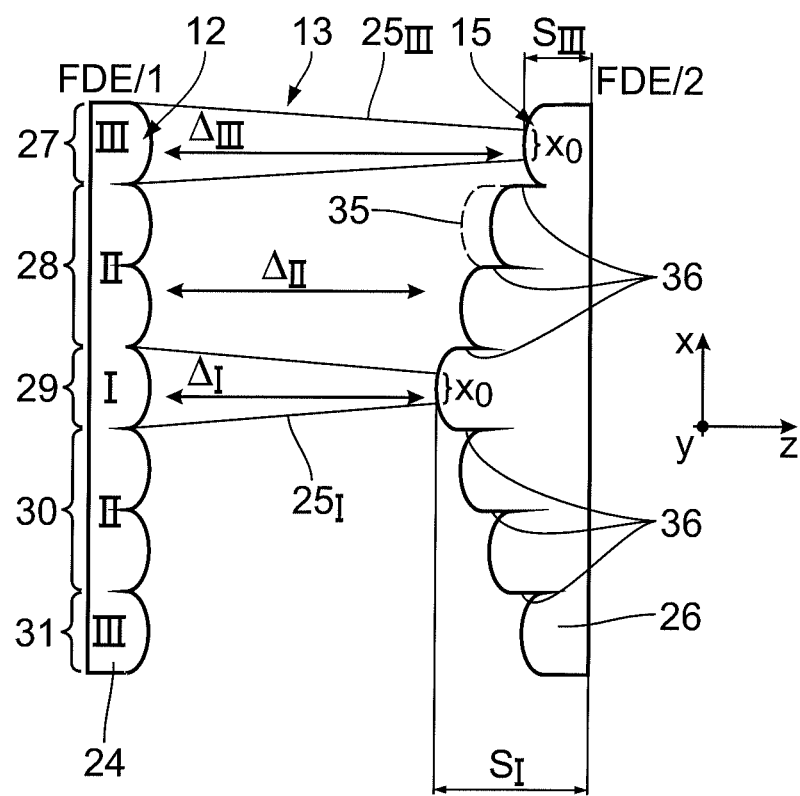
FIG. 2 shows an embodiment according to the disclosure of the raster module of the illumination system according to FIG. 1 including a non-stepped first raster arrangement and a second raster arrangement which is provided with a step between individual elements.
Figure 5:
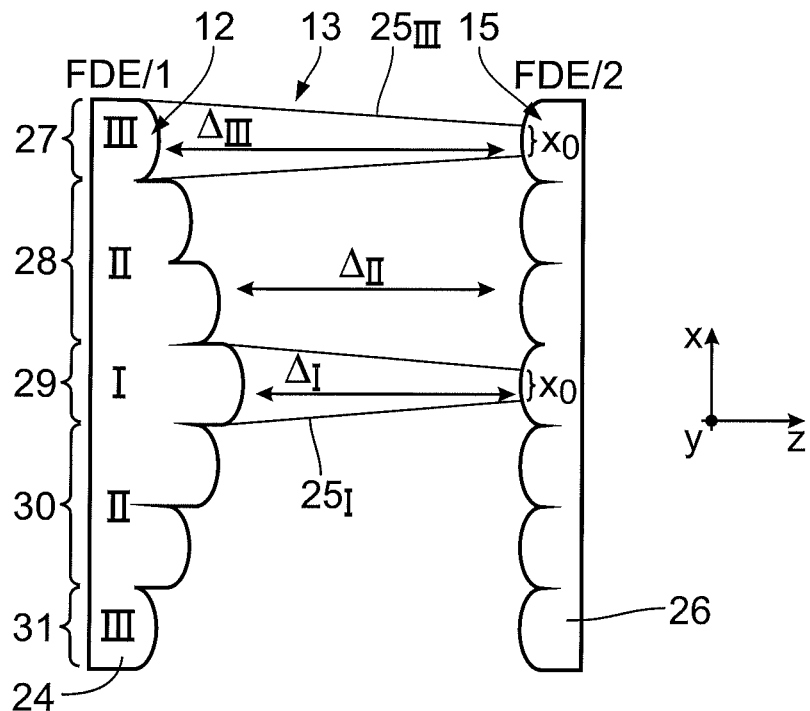
FIGS. 5 to 10 show further embodiments of raster modules including raster arrangements which are provided with steps between individual elements or areas.

In the region of the first illumination plane 11, there is arranged a first raster arrangement 12 of a raster module 13 which is also referred to as honeycomb condenser. The raster module 13 is also referred to as field defining element (FDE). The raster module 13 serves to generate a defined intensity and illumination angle distribution of the illumination light 8. In FIG. 1, the raster module 13 is only shown in a schematic illustration in order to describe the basic functioning principle thereof. FIGS. 2 and 5 et seq. show other embodiments of the raster module 13 according to the disclosure.

A second raster arrangement 15 is arranged in another illumination plane 14 which is downstream of the first illumination plane 11. The two raster arrangements 12, 15 form the honeycomb condenser 13 of the illumination system 5. Arranged downstream of the other illumination plane 14 is a pupil plane 16 of the illumination system 5.

Arranged downstream of the raster module 13 is another condenser 17 which is also referred to as field lens. Together with the second raster arrangement 15, the condenser 17 images approximately the first illumination plane 11 into an intermediate field plane 18 of the illumination system 5. In the intermediate field plane 18, a reticle masking system (REMA) 19 may be arranged which is an adjustable shading stop for generating a sharp edge of the illumination light intensity distribution. A downstream objective 20, which is also referred to as relay objective, images the intermediate field plane 18 onto the reticle, in other words the lithography template. A projection objective 21 is used to image the object field 3 onto a wafer (not shown in FIG. 1) arranged in an image field 22 in an image plane 23, the wafer being displaced along the y-direction intermittently or continuously. A pupil plane of the projection objective 21 is indicated at 23a in FIG. 1. If the projection exposure apparatus 1 is operated in such a way that the reticle and the wafer are displaced intermittently, then it is also referred to as stepper. If the projection exposure apparatus 1 is operated in such a way that the reticle and the wafer are displaced continuously, then it is also referred to as scanner.

The first raster arrangement 12 has individual first raster elements 24 which are arranged in columns and rows. The first raster elements 24 have a rectangular aperture with an x/y aspect ratio of for example 2/1. Other, in particular larger aspect ratios of the first raster elements 24 are conceivable as well. In order to facilitate the description, first raster elements 24 are hereinafter shown to have an x/y aspect ratio of 1/1 in FIGS. 8 to 10.

Alternatively, the raster arrangements 12 and 15 may in each case consist of cylindrical lenses which are arranged crosswise and disposed next to one another. Each of the raster arrangements 12, 15 may in this case be designed as a monolithic lens block. One of the two optical surfaces of the lens block then includes cylindrical lens surfaces which are oriented in a first direction while the opposite one of the two optical surfaces includes cylindrical lens surfaces which are oriented in a direction perpendicular thereto.

The meridional section according to FIG. 1 runs along an x-raster column. The first raster elements 24 are microlenses which have a positive refractive power. In the illustration according to FIG. 1, these microlenses are shown to be plane convex. In the schematic illustration according to FIG. 1, the plane surfaces of the two raster arrangements 12, 15 face each other. As will hereinafter be explained via FIGS. 2 and 5 et seq., the convex surfaces of the two raster arrangements 12, 15 may also be arranged in such a way as to face each other. A biconvex design is conceivable as well. The rectangular shape of the first raster elements 24 corresponds to the rectangular shape of the illumination field 3. The first raster elements 24 are arranged in such a way as to directly abut each other in a raster which corresponds to their rectangular shape, in other words they fill essentially the entire surface. The first raster elements 24 are also referred to as field honeycombs.

The bundle-forming effect of the first raster elements 24 of the first raster arrangement 12 causes the illumination light 8 to be divided into a number of partial bundles 25 (cf. for example FIG. 2) which number corresponds to the number of illuminated first raster elements 24; the partial bundles 25 are also referred to as light channels or illumination channels as they are at first guided through the raster module 13 separately from each other. The raster module 13 may be provided with several hundreds of such light channels which are in each case offset relative to each other by the respective x or y raster size when seen in the x or y direction. These light channels are superimposed in the object field 3.

In order to transmit the respective partial bundle 25, second raster elements 26 of the second raster arrangement 15 are allocated to the first raster elements 24 of the first raster arrangement 12. The second raster elements 26 are microlenses which have a positive refractive power as well.

FIG. 1 shows five light channels of this type which are arranged next to one another when seen in the x-direction. In the embodiments of the raster module 13 according to the disclosure, a total of seven raster elements 24, 26, which are arranged next to one another when seen in the x-direction, are shown in FIGS. 2 and 5 et seq. for generating seven adjacent partial bundles or light channels 25.

The distance of the second raster arrangement 15 from the first raster arrangement 12 approximately corresponds to the focal width of the raster elements 24. The distance of the pupil plane 16 from the second raster arrangement 15 in turn corresponds to the focal width of the second raster elements 26.

The raster elements 24, 26 are aspheric lenses. A sagittal height h of the each of the lens surfaces of the raster elements 24, 26 may be represented by the following aspheric equation:

$$h(x) = \frac{x^2}{R\left(1 + \left(\sqrt{1 - (1+C)\left(\frac{x}{R}\right)^2}\right)\right)} + A_4 x^4 + A_6 x^6 + A_8 x^8 + \ldots$$

In this equation, h(x) represents the sagittal height as a function of the x-coordinate (field or lens coordinate);

R is the radius of the microlens surface at the apex;

C is the conical constant;

$A_n$ are aspheric expansion constants.

The first raster arrangement 12 has various types of first raster elements 24, in other words various types of aspheric microlenses. The types of the first raster elements 24 have different bundle-influencing, in other words refractive effects.

Figure 3:
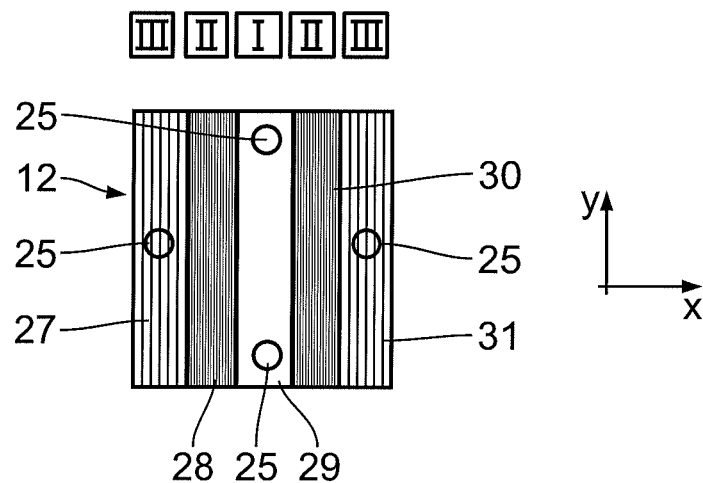
FIG. 3 is a plan view of the first raster arrangement according to FIG. 2, with five raster areas which are in each case provided with one of a total of three different types of raster elements being shown in a schematic illustration.

FIG. 3 shows a division of the first raster arrangement 12 of the raster module 13 into a total of five raster areas 27 to 31. Each of the raster areas 27 to 31 runs in the y-direction in the shape of a column. When seen in the x-direction, each of the raster areas 27 to 31 may include exactly one raster element 24 or a plurality of raster elements 24. Usually, each of the raster areas 27 to 31 has a plurality of raster elements 24. Each of the raster areas 27 to 31 is composed of raster elements 24 of exactly one type, in other words they have exactly one refractive effect.

For the following description, the schematic division according to FIG. 2 including a total of seven raster elements 24 which are arranged next to one another when seen in the x-direction is as follows: The uppermost raster element 24 according to FIG. 2 is part of the raster area 27, the two raster elements 24 arranged closest thereto are part of the raster area 28, the central raster element 24 of FIG. 2 is part of the raster area 29, the two raster elements 24 arranged closest thereto are part of the raster area 30 and the lowermost raster element 24 of FIG. 2 is part of the raster area 31.

The raster elements 24 in the central raster area 29 belong to type I of the raster elements which have a conical constant C in the range of 0.2 and a smallest lens radius R, in other words they have the highest refractive effect. The raster elements 24 in the raster areas 28 and 30 are of a type II with a conical constant C in the range of 0.05 and a refractive effect which is lower than that of the raster elements 24 in the raster area 29, in other words they have a slightly larger lens radius R. The raster elements 24 in the raster areas 27 and 31 are of a type III with a conical constant C in the range of −0.1 and a lowest refractive effect, in other words a largest lens radius R. Between type I and type III, the conical constant C thus differs by 0.3. The conical constants C of the types I, II, III may also assume other values from a range of values for the conical constant C of between −0.3 and +0.3, wherein the type with the highest refractive effect has the greatest conical constant C while the type with the lowest refractive effect has the smallest conical constant C. In another embodiment, the conical constant C is in the range of 0.05 for type II, in the range of 0.1 for type I and in the range of 0.0 for type III. The conical constant C of type I may for example vary in a range of between 0.09 and 0.25. The conical constant of type II may vary in a range of between −0.09 and +0.09. The conical constant C of type III may vary in a range of between −0.25 and −0.09.

Figure 4:
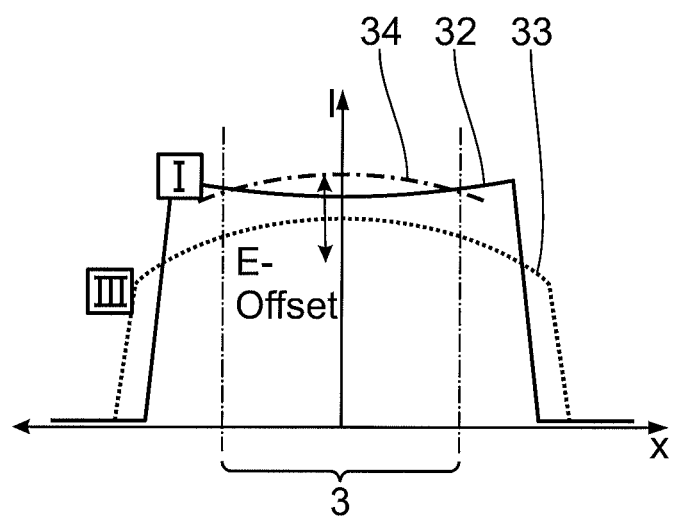
FIG. 4 is a schematic view of a diagram illustrating intensity distributions I(x) across an illumination field illuminated by an illumination system for two of the total of three raster element types of the first raster arrangement of the raster module according to FIG. 3, wherein the intensity distributions I(x) are not distance compensated.

FIG. 4 shows an effect of the raster elements 24 of type I and III which, because of their different refractive powers, is not distance-compensated, in other words it is not according to the disclosure. The Figure shows an intensity I across a field coordinate x in the region of the object field 3. The high refractive effect of the raster elements 24 of type I causes the allocated partial bundle 25 to be heavily constricted on the allocated entrance surfaces of the allocated second raster elements 26 which in turn causes an intensity curve 32 across the field coordinate x to be constricted as well. The conical constant C of the raster elements 24 of type I results in a "concave" intensity curve 32 across the object field 3, in other words the intensity curve 32 is curved in such a way as to be upwardly open.

Due to their lower refractive powers, the bundle-guiding effects of the raster elements 24 of type III causes the partial bundles to be constricted less on the second raster elements 26 which in turn results in a broader intensity curve 33 across the field coordinate x. The conical constant C of the raster elements 24 of type III results in a "convex" intensity curve 33 across the object field 3, in other words the intensity curve 33 is downwardly open.

If there is no distance compensation as will be explained below, the constricting effect of the raster elements 24 of type I, which have a higher refractive effect than the raster elements 24 of type III, results in that when integrated over the object field 3, the intensity contribution of type I is higher than that of type III as will become apparent when comparing the intensity levels of the intensity curves 32, 33 across the object field 3 in FIG. 4.

According to the disclosure, this intensity difference of the curves 32, 33 across the object field 3 is compensated for by a variation of distances Δ between the raster elements 24, 26 allocated to each other via the partial bundles 25. This will hereinafter be explained via FIG. 2. As discussed above, the raster elements 24 of type I have a higher refractive effect than the raster elements of type III. Therefore, the partial bundles $25_I$ formed by the raster elements 24 of type I have edge rays which converge more than those of the partial bundles $25_{III}$ generated by the raster elements 24 of type III. On the other hand, the distance $\Delta_I$ between the raster elements 24, 26 in the raster area 29 is smaller than the distance $\Delta_{III}$ between the raster elements 24, 26 of the raster areas 27 and 31. So regardless of whether it is of type I or III, the partial bundle 25 impinging upon the allocated raster element 26 therefore has the same extension $x_0$ in the x-dimension despite the higher refractive effect of the raster elements 24 of type I compared to type III. Likewise, type III of the raster elements, which has a lower refractive effect, has a higher intensity effect across the object field 3 as the larger distance $\Delta_{III}$ causes the partial bundle $25_{III}$ to be collected along the same x-dimension $x_0$ as the partial bundle $25_I$. In the region of the object field 3, the intensity curve 33 generated by type III is thus raised up to the intensity curve 34 which is illustrated by a dot-dashed line. When integrated over the object field 3, the two types I and III provide the same intensity contribution despite their different refractive effects, which intensity contribution differs only in terms of its concave or convex curve which is due to the different conical constants of the types I and III.

The different refractive effect of the types I and III therefore allows an intensity offset correction to be performed across the used object field 3, which is indicated in FIG. 4 by "E-Offset" and a double-headed arrow extending along the intensity axis.

The refractive effect of type II of the raster elements 24 in the raster areas 28, 30 is between the refractive effects of types I and III, with the result that type II has a corresponding intensity-adjusting effect. The schematic illustration of the raster module 13 according to FIG. 2 shows two different distances Δ between the allocated raster elements 24, 26 in the raster areas 28, 30, with the result that a distance variation is obtained between individual elements of the second raster arrangement 15. The second raster elements 26 of the second raster arrangement 15 may alternatively be arranged at a uniform distance Δ from the allocated raster elements 24 of the first raster arrangement 12 as shown in FIG. 2 by a dashed line at 35 so that in this case, a uniform distance $\Delta_{II}$ is provided.

The distance variation with the different distances $\Delta_I$, $\Delta_{II}$, $\Delta_{III}$ is obtained via a thickness variation of the second raster arrangement 15 which thickness variation extends across the x-direction in the manner of a ridge. The second raster arrangement 15 has a highest raster thickness $S_I$ in the center, in other words in the raster area 29, and a lowest thickness $S_{III}$ at the edge, in other words in the raster areas 27, 31. When looking at the second raster arrangement 15 which is represented by a continuous line, the thickness S measured in the z-direction decreases from element to element via distance steps 36.

The distances Δ between the raster arrangements 12, 15 are greatly exaggerated in FIGS. 2 and 5 et seq. when compared to the respective x-dimension of the raster elements 24, 26.

The following tables show examples of absolute distance or air gap changes which are used when the conical constant C or the radius of curvature of the respective first raster element 24 is changed. The change of the conical constant C is referred to by ΔC in the first table.

When the conical constant C is changed by for example 0.05, a change of the distance Δ of 13 μm is used for compensation.

The change of radius is given in percent in the second table.

| ΔC | Change of air gap [μm] |
|---|---|
| 0.05 | 13 |
| 0.1 | 27 |
| 0.2 | 53 |
| 0.3 | 80 |

| Change of radius [%] | Change of air gap [µm] |
|---|---|
| 1 | 16 |
| 2 | 29 |
| 3 | 45 |
| 5 | 74 |

FIG. 3 shows an exemplary quadrupole illumination of the first raster arrangement 12 and therefore of the raster module 13 of the illumination system 5 of the projection exposure apparatus 1. The first raster arrangement 12 is exposed to a total of four partial bundles which impinge upon the first raster arrangement 12 at the corners of a rhombus. In other words, the central raster area 29 is impinged by two partial bundles 25 which, when seen in the y-direction, are in each case close to the two edges of the raster area 29. In the raster areas 27 and 31, the first raster arrangement 12 is impinged centrally by a respective one of the partial bundles 25 when seen in the y-direction. In this quadrupole illumination, the different types I and III of the raster elements 24 allow an ellipticity variation of the illumination of the object field 3, which is caused by other optical components of the projection exposure apparatus 1, to be compensated for.

The ellipticity is a measure for assessing the quality of the illumination of the object field 3 in the object plane 4. Determining the ellipticity allows one to better predict the distribution of energy or intensity across an entrance pupil of the projection objective 21. To this end, the entrance pupil of the projection objective 21 is divided into eight octants which are numbered by $O_1$ to $O_8$ in the anticlockwise direction as is common practice in mathematics. The energy or intensity contribution provided by the octants $O_1$ to $O_8$ of the entrance pupil for illuminating a field point is hereinafter referred to as energy or intensity contribution $I_1$ to $I_8$.

The following quantity is referred to as −45°/45° ellipticity (Elly, $E_{-45°/45°}$):

$$E_{-45°/45°} = \frac{I1 + I2 + I5 + I6}{I3 + I4 + I7 + I8}$$

while the following quantity is referred to as 0°/90° ellipticity (Ellx, $E_{0°/90°}$):

$$E_{0°/90°} = \frac{I1 + I8 + I4 + I5}{I2 + I3 + I6 + I7}.$$

The aspheric shape of the first raster elements 24 is produced in a multistage forming process. In this process, the raster arrangement 12 is at first produced in such a way as to have raster elements 24 with one and the same conical constant. Afterwards, a desired variation of the conical constants is performed which results in the different types I, II, III. This also results in the different lens radii, and therefore in the different refractive effects of the types I to III. Alternatively, the raster arrangement 12 may also be provided with the different lens radii of the types I to III in a single production step.

FIG. 5 shows another embodiment of a raster module 13 which is provided with distance variations between individual elements. Components and effects which correspond to those that have already been explained above with reference to FIGS. 1 to 4 are denoted by the same reference numerals and are not discussed in detail again.

In the embodiment of the raster module 13 according to FIG. 5, the first raster arrangement 12 is provided with distance variations in the manner of a ridge between individual elements. As a result, there is a smallest distance $\Delta_I$ between the allocated raster elements 24 and 26 in the central raster area 29 while there is a largest distance $\Delta_{III}$ between the allocated raster elements 24 and 26. In analogy to the above description relating to the embodiment according to FIG. 2, the different constricting effects of types I and III exerted on the partial bundles $25_I$ to $25_{III}$ by the raster elements 24 are distance-compensated as well, with the result that the partial bundles $25_I$ to $25_{III}$ again have the same x-extension $x_0$ on the raster elements 26 of the second raster arrangement 15. Consequently, the same offset compensation of the different intensity curves is obtained as already discussed above with reference to FIG. 4.

Figure 6:
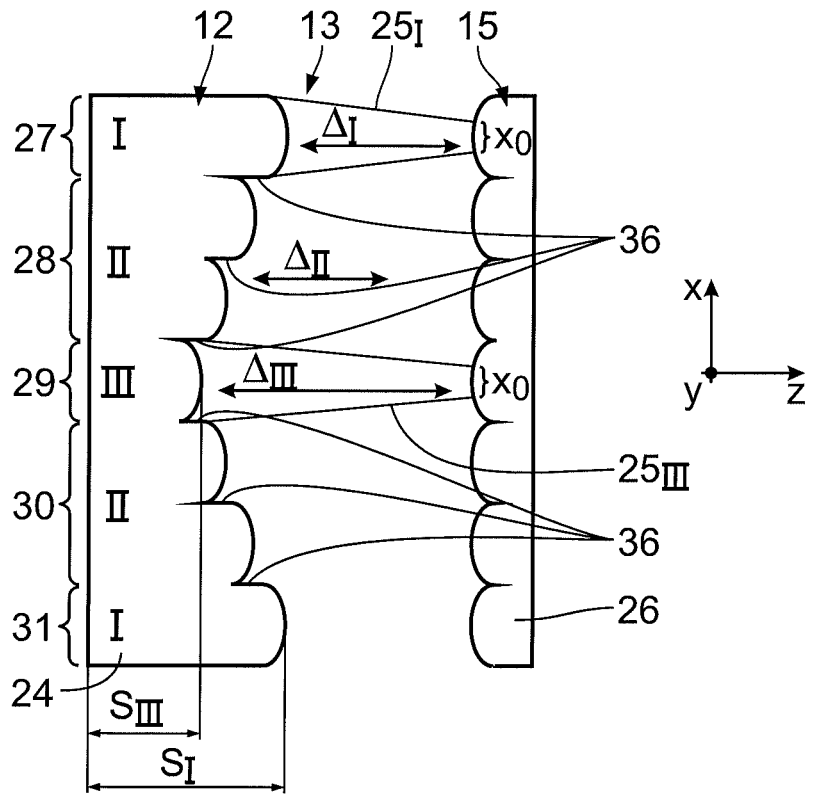

FIG. 6 shows another embodiment of a raster module 13. Components and effects which correspond to those that have already been explained above with reference to FIGS. 1 and 5 are denoted by the same reference numerals and are not discussed in detail again. The raster arrangement 12 according to FIG. 6 is designed in the manner of an inverted ridge, in other words it has a smallest thickness $S_3$ in the region of the center and a largest thickness $S_1$ at the edges. Likewise, the types I to III of the first raster elements 24 in the embodiment of the first raster arrangement according to FIG. 6 are distributed across the x-dimension of the first raster arrangement 12 in an inverted manner as well.

Type III with the lowest refractive effect is disposed in the center, in other words in the raster area 29. The raster elements 24 of type I, in other words the raster elements 24 with the highest refractive power, are disposed at the edges, in other words in the raster areas 27, 31. The raster elements 24 of type II are arranged in-between, in other words in the raster areas 28 and 30. The raster arrangement 12 according to FIG. 6 is provided with distance steps 36 between the individual elements as well.

The distance $\Delta_{III}$, which is large compared to the distance $\Delta_I$, compensates for the refractive effect of type III which is lower than that of type I, with the result that regardless of whether the raster elements 26 are equipped with type I, II or III, the partial bundles $25_1$ to $25_3$ also have the same x-extension $x_0$ in the raster module 13 according to FIG. 6.

Figure 7:
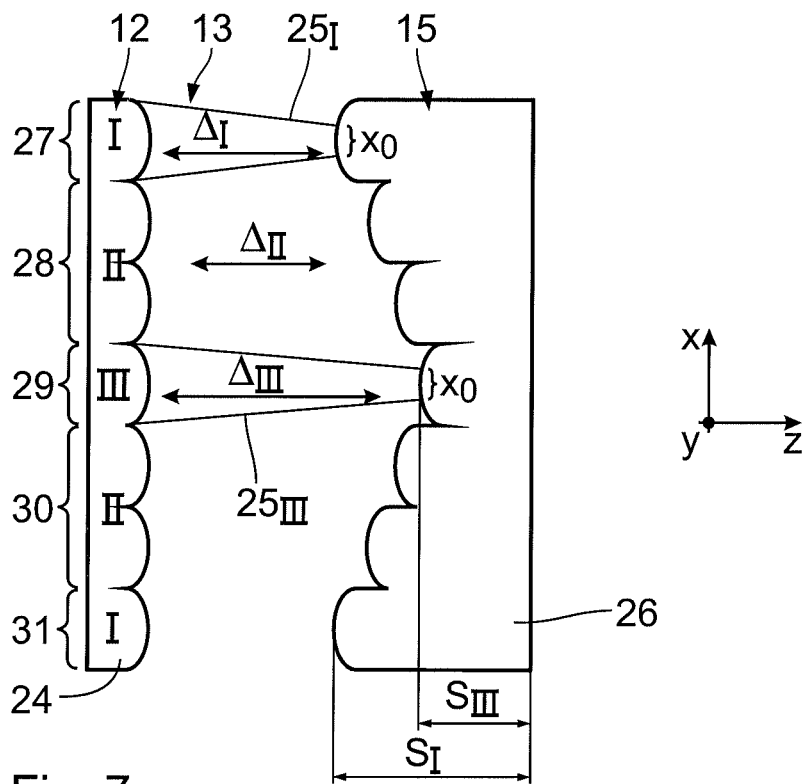

FIG. 7 shows another embodiment of a raster module 13. Components and effects which correspond to those that have already been explained above with reference to FIGS. 1 to 6 are denoted by the same reference numerals and are not discussed in detail again.

In FIG. 7, in contrast to the raster module 13 according to FIG. 6, it is not the first raster arrangement 12 but the second raster arrangement 15 which is an element in the shape of an inverted ridge having a smallest thickness $S_{III}$ in the center and a largest thickness $S_I$ at the edges. As a result, the distances $\Delta_I$ to $\Delta_{III}$ have a corresponding compensatory effect on the partial bundles $25_1$ to $25_3$ as already explained above with reference to the raster module 13 according to FIG. 6.

Figure 8:
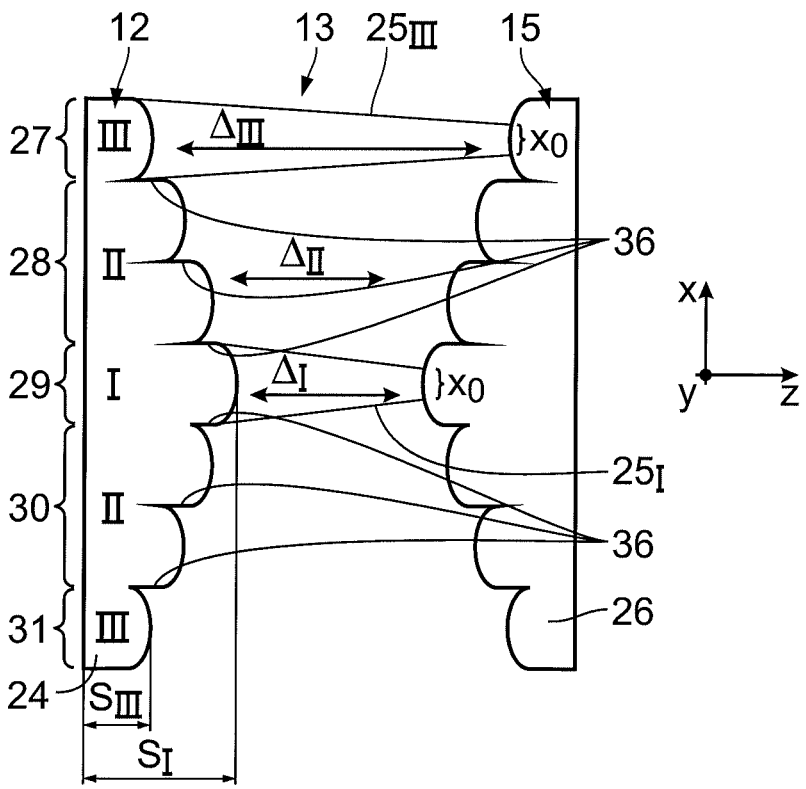

FIG. 8 shows another embodiment of a raster module 13. Components and effects which correspond to those that have already been explained above with reference to FIGS. 1 to 7 are denoted by the same reference numerals and are not discussed in detail again.

In the raster module 13 according to FIG. 8, both raster arrangements 12, 15 are provided with ridge-like steps between individual elements. The two ridges of the raster arrangements 12, 15 face each other, with the result that there is a lowest distance $\Delta_I$ in the raster area 29 while there is a largest distance $\Delta_{III}$ between the raster elements 24, 26 at the edges. The arrangement of the raster module 13 according to FIG. 8 is selected if the types I and III have a larger difference in terms of their refractive effects than those of the arrangement according to FIGS. 2 and 5.

Figure 9:
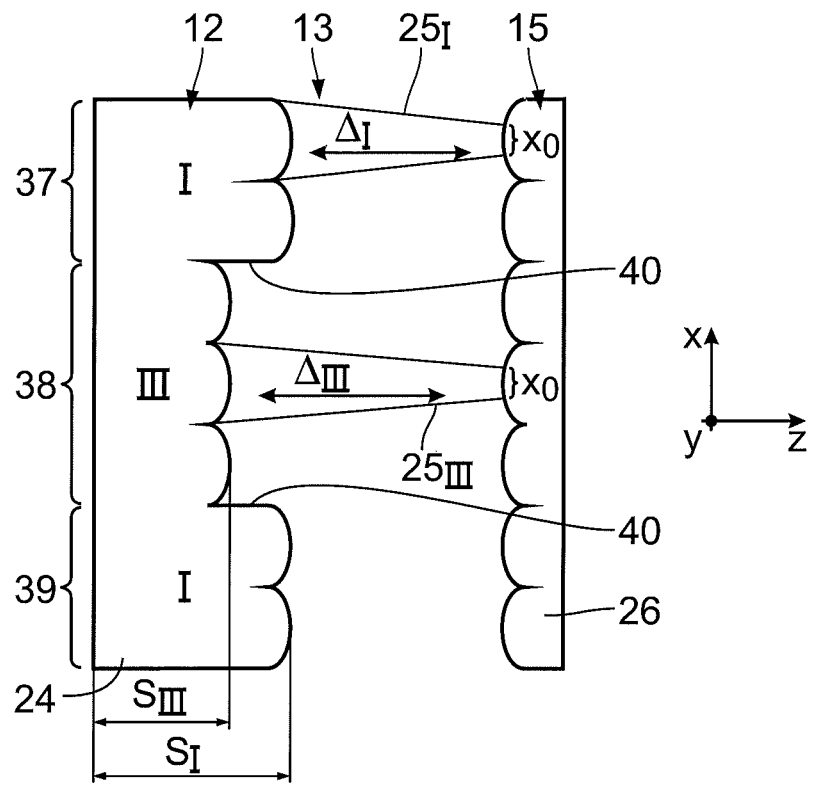

FIG. 9 shows another embodiment of a raster module 13. Components and effects which correspond to those that have already been explained above with reference to FIGS. 1 to 8 are denoted by the same reference numerals and are not discussed in detail again.

Other than in the embodiments according to FIGS. 2 and 5 to 8 described above, the embodiment according to FIG. 9 is only provided with three raster areas, namely the raster areas 37, 38 and 39. In the schematic illustration according to FIG. 9, the first raster arrangement 12 of the raster module 13 according to FIG. 9 again has a total of seven of the first raster elements 24 when seen in the x-direction. The raster elements 24 in the raster areas 37 and 39 are of type I which has the higher refractive power. The raster elements 24 of the first raster arrangement 12 in the central raster area 28 are of type III which has the lower refractive power. In the raster areas 37 and 39, there are in each case two raster elements 24 of type I. In the raster area 38, there are three raster elements 24 of type III which are disposed next to one another.

Between the raster areas 37 and 38 on the one hand and between the raster areas 38 and 39 on the other, the first raster arrangement 12 includes in each case one distance step 40. A distance $\Delta_I$ between the raster elements 24 in the raster area 37 and the allocated raster elements 26 of the second raster arrangement 15 is smaller than a distance $\Delta_{III}$ between the first raster elements 24 in the raster area 38 and the allocated second raster elements 26. As a result, the different distances $\Delta_I$ and $\Delta_{III}$ compensate for the different refractive effects of types I and III as already explained above with reference to the raster module 13 according to FIG. 6.

Figure 10:
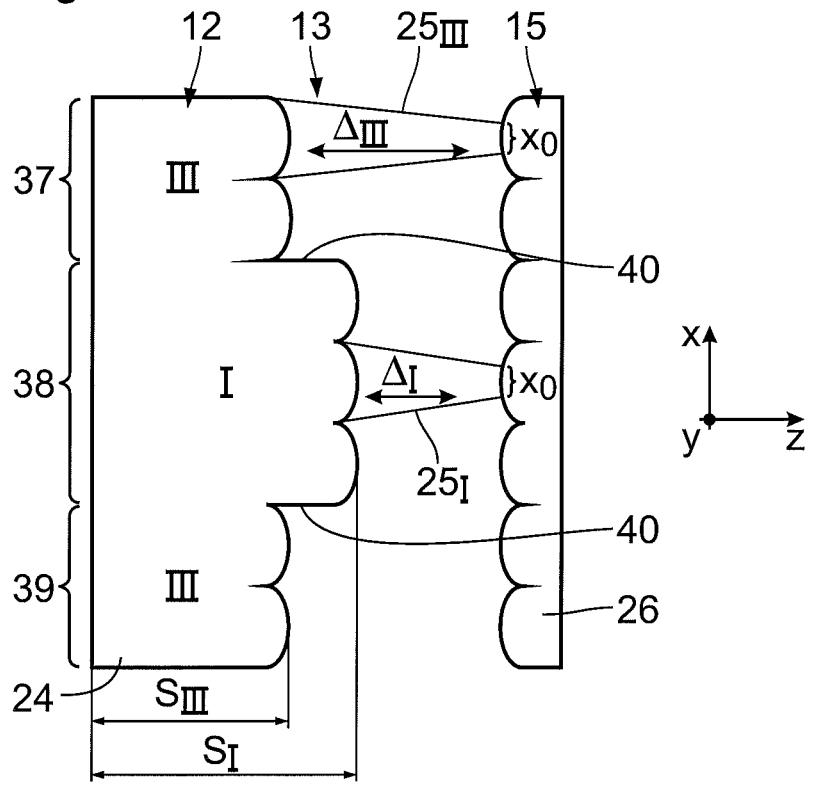

FIG. 10 shows another embodiment of a raster module 13. Components and effects which correspond to those that have already been explained above with reference to FIGS. 1 to 8 and in particular with reference to FIG. 9 are denoted by the same reference numerals and are not discussed in detail again.

In the raster module 13 according to FIG. 10, the first raster arrangement 12 is inverted relative to the raster arrangement 12 according to FIG. 9. The raster elements 24 of type I with the higher refractive power are arranged in the central raster area 38 while the raster elements 24 of type III with the lower refractive power are arranged in the raster areas 37 and 39 at the edges. As the distance $\Delta_{III}$ at the edges now exceeds the distance $\Delta_I$, a compensatory effect is obtained as already explained with reference to the embodiment of the raster module 13 according to FIG. 5.

During microlithographic production of a microstructured or nanostructured component using the projection exposure apparatus 1, a substrate is provided which is at least partially provided with a layer of a light-sensitive material. The substrate is usually a wafer. Furthermore a reticle is provided which is provided with the structure to be imaged. The projection exposure apparatus 1 is then used to project at least a portion of the reticle onto a region of the light-sensitive layer on the substrate.

Figure 11:
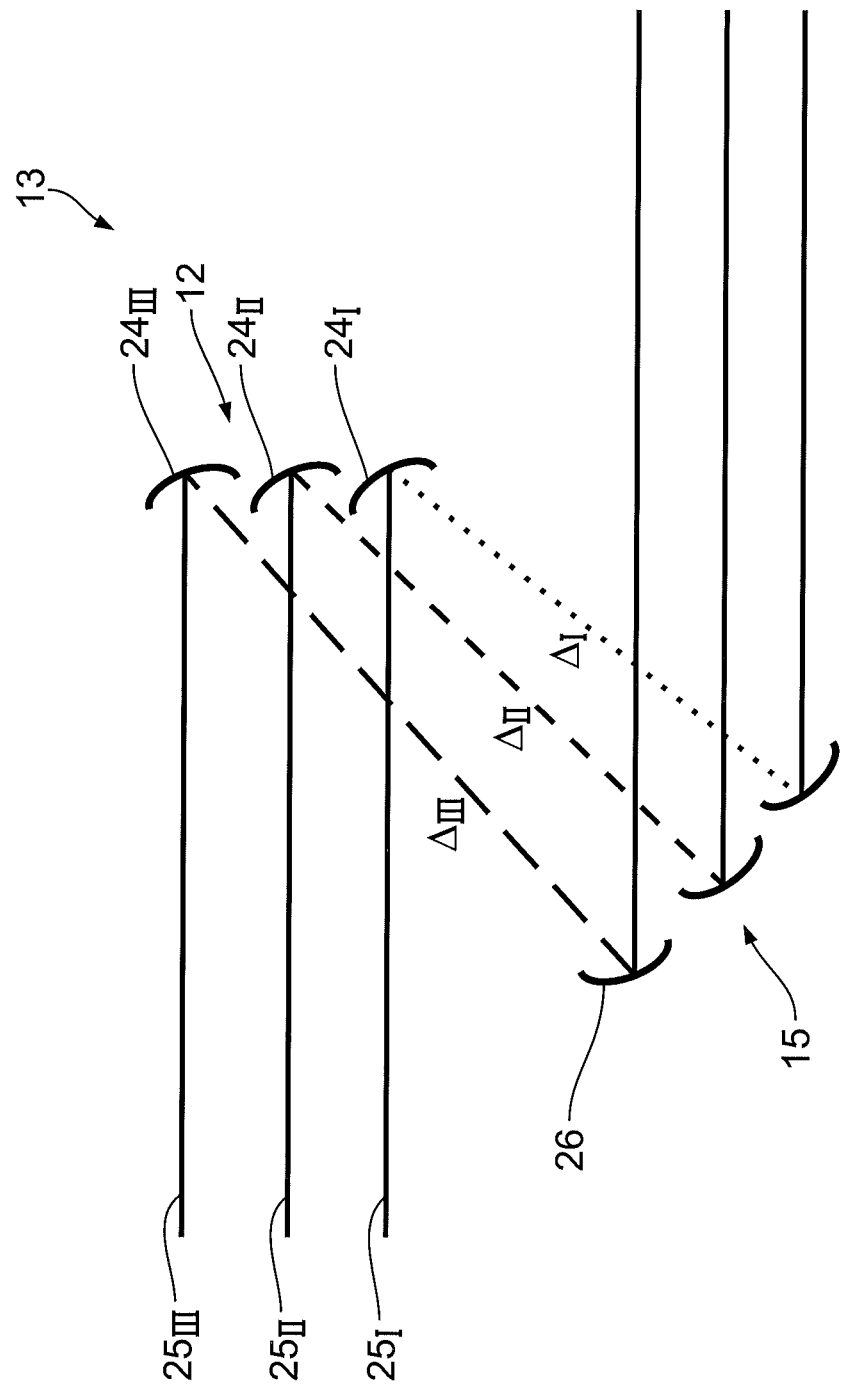
FIG. 11 is a meridional section through a raster module including two reflective raster arrangements in which the distances between the raster elements of the two raster arrangements allocated to each other are individual from type to type.

The following is a description of another embodiment of a raster module 13 according to FIG. 11. Components and effects which correspond to those that have already been explained above with reference to FIGS. 1 to 10 are denoted by the same reference numerals and are not discussed in detail again.

In the raster module 13 according to FIG. 11, the two raster arrangements 12, 15 are provided with reflective first raster elements 24 and with reflective second raster elements 26. Because of their reflective powers, the raster elements 24 of the first raster arrangement 12 in the embodiment according to FIG. 11 have different bundle-influencing effects instead of different refractive effects. Thus the raster element $24_{III}$ of type III shown at the top of FIG. 11 may be designed in such a way as to exert a lowest focusing effect on a partial bundle $25_{III}$ while the raster element $24_I$ of type I shown at the bottom of FIG. 11 may be designed in such a way as to have a highest focusing effect on a partial bundle $25_I$. The focusing effect exerted on the partial bundle $25_{II}$ by the raster element $24_{II}$ shown in-between lies between the two focusing effects of the raster elements $24_I$ and $24_{III}$.

The two raster arrangements 12, 15 are arranged in space relative to each other in such a way that an optical path length $\Delta$ between one of the first raster elements 24 and a second raster element 26 of the second raster arrangement 15 allocated thereto is such that the following relation applies:

$$\Delta_I < \Delta_{II} < \Delta_{III}.$$

This individual allocation of distances $\Delta_I$ to $\Delta_{III}$ to type I to III of the first raster element 24 results in a compensating effect as already explained above for example with reference to the raster module 13 according to FIG. 2.

The two raster arrangements 12, 15 of the embodiments explained above may also be arranged in the beam path of the illumination light 8 in the opposite order.

Figure 12:
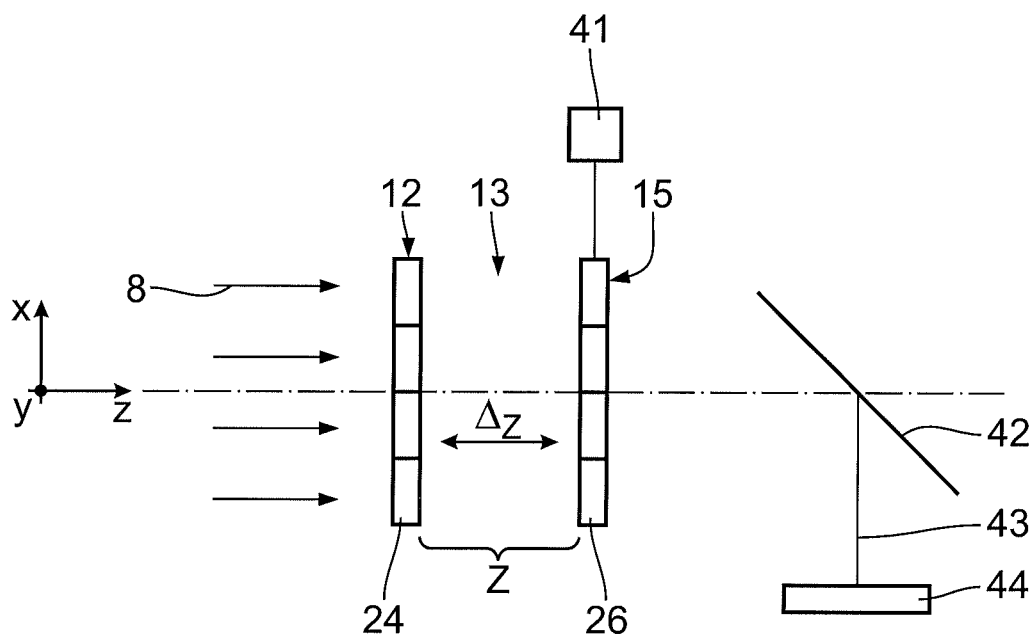
FIG. 12 is a schematic illustration of a raster module including two raster arrangements, the illustration outlining a degree of freedom when the two raster arrangements are displaced relative to each other.

FIG. 12 is a schematic illustration of another embodiment of the raster module 13 including raster arrangements 12, 15 with raster elements 24, 26. Components and effects which correspond to those that have already been explained above with reference to FIGS. 1 to 11 are denoted by the same reference numerals and are not discussed in detail again.

In the raster module 13 according to FIG. 12, the two raster arrangements 12, 15 are displaceable in the z-direction, in other words perpendicular to the xy-planes spanned by the two raster arrangements 12, 15, along a displacement path $\Delta_z$. In the embodiment shown in FIG. 12, it is the second raster arrangement 15 that is displaced in the z-direction. To this end, the second raster arrangement 15 is mechanically connected to a displacement device 41. The displacement device 41 may be a linear displacement unit suitable for the displacement of optical components or a micromechanical actuator.

An output coupling mirror 42 is arranged in the beam path downstream of the second raster arrangement 15 which output coupling mirror 42 is partially permeable to the illumination light 8. Via the output coupling mirror 42, a partial beam 43 of the illumination light 8 is transmitted to a position-sensitive detector 44 such as a CCD array. The detector 44 is in a signal connection with the displacement device 41 via a central control device not shown in the drawing. The detector 44 detects an illumination intensity distribution of the partial beam 43 which allows conclusions to be drawn about an illumination intensity distribution and/or an illumination angle distribution of the illumination light 8 in the object plane 4.

The $\Delta_z$ displacement of the raster arrangement 15 relative to the raster arrangement 12 allows an offset correction of the intensity across the used object field 3 to be performed as already explained above with reference to FIG. 4. The larger a distance Z between the two raster arrangements 12, 15, the smaller an x-extension of the illumination field, with the result that the intensity is focused more in the object field 3.

Furthermore, the $\Delta_z$ displacement may be used to achieve an offset of ellipticity, in other words of the quantities $E_{-45°/45°}$ or $E_{0°/90°}$, for example, which have already been discussed above. The $\Delta_z$ displacement also allows a uniformity of an illumination of the object field 3 to be adjusted. The uniformity is defined as the normalized scan-integrated total energy SE (x) for an x-value in the object field 3, in other words a field height. The uniformity U is such that $$U(\text{in percent}) = 100(SE(x_{max}) - SE(x_{min}))/(SE(x_{max}) + SE(x_{min})),$$

with $SE(x_{max})$ being the total energy for the x-value $x_{max}$ with the highest scan-integrated total energy. $SE(x_{min})$ on the other hand is the total energy for the x-value $x_{min}$ with the lowest scan-integrated total energy.

Furthermore, the $\Delta_z$ displacement may be used to perform an offset correction of a telecentricity.

The telecentricity is a measure for a chief illumination angle direction of the energy or intensity of the illumination light incident on the object field 3.

A chief ray of a light bundle allocated to a field point is defined for each field point of the illuminated object field. The chief ray has the energy-weighted direction of the light bundle emitted by this field point. Ideally, the chief ray of each field point is parallel to the principal ray determined by the illumination optical system or the projection objective 21.

The direction of the principal ray $\vec{s}_0$ (x,y) is known from the design data of the illumination optical system or the projection objective 21. The principal ray of a field point is defined by the connection line between the field point and the central point of the entrance pupil of the projection objective 21. The direction of the chief ray at a field point x, y in the object field in the object plane 3 is obtained as follows:

$$\vec{s}(x, y) = \frac{1}{\tilde{E}(x, y)} \int du\, dv \begin{pmatrix} u \\ v \end{pmatrix} E(u, v, x, y).$$

E(u,v,x,y) is the energy distribution for the field point x, y as a function of the pupil coordinates u, v, in other words it depends on the illumination angle seen by the respective field point x, y. $\tilde{E}(x,y) = \int du\, dv\, E(u,v,x,y)$ is the total energy incident on the point x, y.

A for example central object field point $x_0$, $y_0$ sees the radiation of partial radiation bundles from directions u, v which are defined by the position of the respective raster elements 26 on the second raster arrangement 15. In this illumination example, the chief ray travels along the principal ray only if the different energies or intensities of the partial radiation bundles or illumination channels allocated to the raster elements 26 combine to form a chief ray direction which is integrated over all raster elements 26 and which is parallel to a principal ray direction of the illumination light 8. This is only the case under ideal circumstances. In practical application, there is a deviation between the chief ray direction $\vec{s}(x,y)$ and the principal ray direction $\vec{s}_0(x,y)$ which is referred to as telecentricity error $\vec{t}(x,y)$:

$$\vec{t}(x,y) = \vec{s}(x,y) - \vec{s}_0(x,y).$$

In the practical application of the projection exposure apparatus 1, it is not the local telecentricity error at a particular object field point (x,y) to be corrected but the telecentricity error which is scan-integrated at $x=x_0$. This telecentricity error is obtained as follows:

$$\vec{T}(x_0) = \frac{\int dy\, \tilde{E}(x_0, y)\vec{t}(x_0, y)}{\int dy\, \tilde{E}(x_0, y)}.$$

In other words, the telecentricity error is corrected which is integrated by a point (x, e.g. $x_0$) on the reticle moving through the object field 3 in the object plane 4 during the scanning process, wherein a difference is made between an x-telecentricity error and a y-telecentricity error. The x-telecentricity error $T_x$ is defined as the deviation of the chief ray from the principal ray in the direction perpendicular to the scanning direction, in other words across the field height. The y-telecentricity error $T_y$ is defined as a deviation of the chief ray from the principal ray in the scanning direction.

The illumination parameters are controllable via the detector 44, the central control device and the displacement device 41, thus allowing the raster module 13 to be operated as a corrective element which can be used during the operation to adjust actual values of the illumination parameters to predetermined desired values. To this end, the central control device evaluates the illumination parameters of the partial beam 43 detected by the detector 44 which allow conclusions to be drawn about the illumination parameters of the illumination light 8. Depending on the actual values of the illumination parameters determined in this manner, the second raster arrangement 15 is then displaced by correspondingly actuating the displacement device 41 via the central control device.

Figure 13:
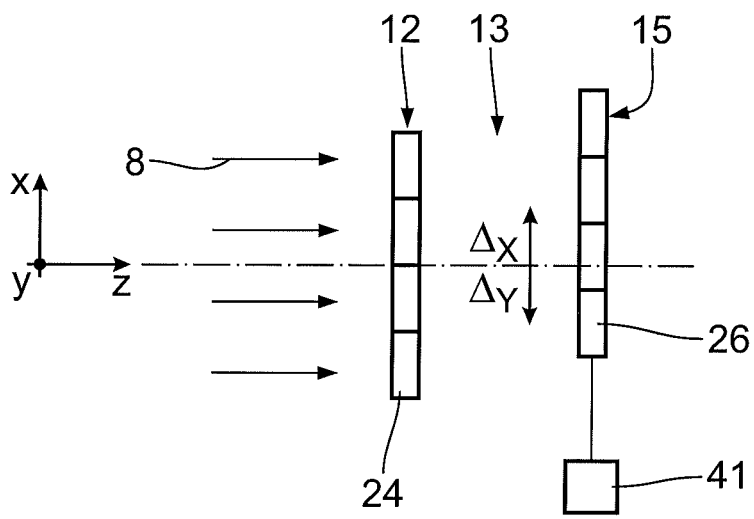
FIG. 13 is an illustration, similar to FIG. 12, of a raster module including two raster arrangements, the illustration outlining two additional degrees of freedom when the two raster arrangements are displaced relative to each other.

FIG. 13 is an illustration similar to FIG. 12 of another embodiment of a raster module 13 with different degrees of freedom for displacement between the two raster arrangements 12 and 15. Components which correspond to those which have already been explained above with reference to the embodiments described above and in particular with reference to the embodiment according to FIG. 12 are denoted by the same reference numerals and are not discussed in detail again.

In the raster module 13 according to FIG. 13, the second raster arrangement 15 is displaceable relative to the first raster arrangement 12 in the x-direction and in the y-direction along displacement paths $\Delta_x$, $\Delta_y$. To this end, the raster module 13 is again equipped with a displacement device 41 which is mechanically coupled with the second raster module 15.

A $\Delta_x$ or $\Delta_y$ displacement of the second raster arrangement 15 relative to the first raster arrangement 12 allows a relative x or y position of the illumination field to be defined relative to the object field 3. A tilt dependence of the telecentricity across the field height x, a so-called telecentricity tilt, as well as a tilt dependence of the ellipticity across the field height x are also adjustable via a $\Delta_x$ or $\Delta_y$ displacement.

Combined with a $\Delta_x$ or $\Delta_y$ displacement, an additional $\Delta_z$ displacement, which—corresponding to the description of the raster module 13 according to FIG. 12—is conceivable for the raster module 13 according to FIG. 13 as well, allows an intensity offset of the illumination light 8 to be adjusted across the object field 3.

If the raster module includes a raster arrangement such as the raster arrangement 12 which is divided into raster areas having different bundle-influencing effects such as the raster areas 27 to 31 according to FIG. 3, then a $\Delta_x$ or $\Delta_y$ displacement results in a tilt change of the ellipticity across the object field 3. This may be used to adjust an ellipticity tilt across the field height x.

A parameter control via a detector and the central control device as described above for the raster module 13 according to FIG. 12 is conceivable for the raster module 13 according to FIG. 13 as well.

Figure 14:
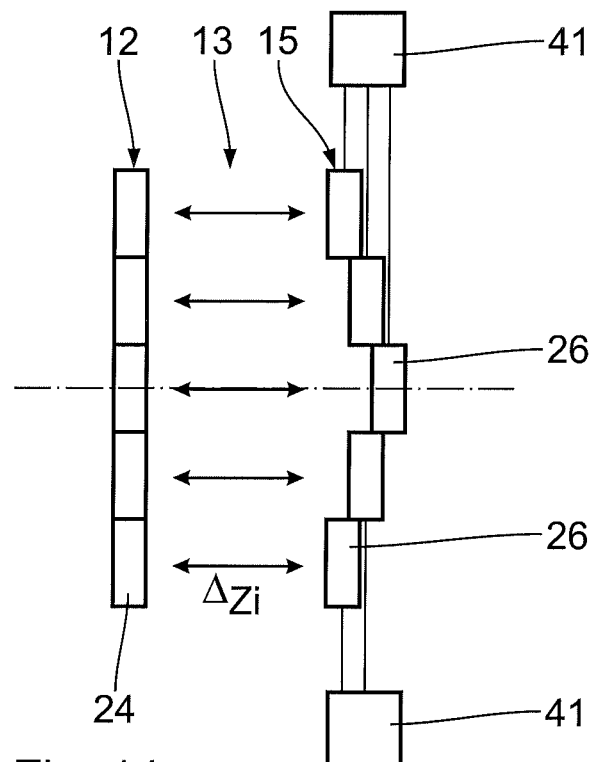
FIG. 14 is an illustration, similar to FIG. 12, of a raster module including two raster arrangements, with raster elements of one of the two raster arrangements being individually displaceable relative to the other raster arrangements.

FIG. 14 is an illustration similar to FIG. 12 of another embodiment of a raster module 13 with different degrees of freedom for displacement between the two raster arrangements 12 and 15. Components which correspond to those which have already been explained above with reference to the embodiments described above and in particular with reference to the embodiment according to FIG. 12 are denoted by the same reference numerals and are not discussed in detail again.

In the raster module 13 according to FIG. 14, it is again the second raster arrangement 15 which is displaceable along the z-direction relative to the first raster arrangement 12. The individual raster elements 26 of the second raster arrangement 15 are displaceable individually and independently of one another along displacement paths $\Delta_{Z1}, \Delta_{Z2}, \ldots, \Delta_{ZN}$. Each of the raster elements 26 is mechanically coupled with an allocated displacement device 41 as schematically indicated in FIG. 14. The displacement devices 41 provide for the individual displacement of the raster elements 26 in the z-direction. An individual displacement device 41 may be allocated to each of the raster elements 26. The displacement of the raster elements 26 via the displacement devices 41 is again controlled by the central control device which is not shown. An illumination parameter control via a detector and the central control device as described above for the raster module 13 according to FIG. 12 is conceivable for the raster module 13 according to FIG. 14 as well.

Depending on the position of the z-displaced raster element 26, locally varying the distances $\Delta_{Zi}$ allows a size of the illumination field segment belonging to the illumination channel to be defined in an adjustable manner, the size of the illumination field segment being determined by the associated illumination channel. Consequently, the ellipse offset can be adjusted as well. A course of the ellipse across the object field 3 may for instance be influenced by varying the distances $\Delta_{Zi}$ in such a way that a predetermined distribution is achieved. This allows the ellipse to be corrected. Likewise, the uniformity may also be adjusted by varying the distances $\Delta_{Zi}$.

In the raster modules 13 according to FIGS. 12 to 14, the displacement devices 41 explained above may be designed in such a way that a periodic displacement of at least one segment of the first raster arrangement 12, in other words at least one of the raster elements 24, a group of raster elements 24 or the entire first raster arrangement 12, relative to at least one segment of the second raster arrangement 15, in other words relative to at least one raster element 26, at least a group of raster elements 26 or relative to the entire raster arrangement 15 takes place at a period which is small compared to a time of exposure of the object or illumination field 3. A displacement device 41 which is able to perform a periodic displacement of this type is also referred to as wobbler.

A wobbler of this type displaces the raster arrangement 15 or segments thereof at a time constant which is such that the illumination channels are displaced each time a light pulse is generated by the primary light source 6. During the time of exposure of a particular segment on a wafer to be illuminated via the projection exposure apparatus 1, this segment is impinged by for example 30 light pulses of the light source 6. During these 30 light pulses, a periodic displacement of the wobbler may occur.

Figure 15:
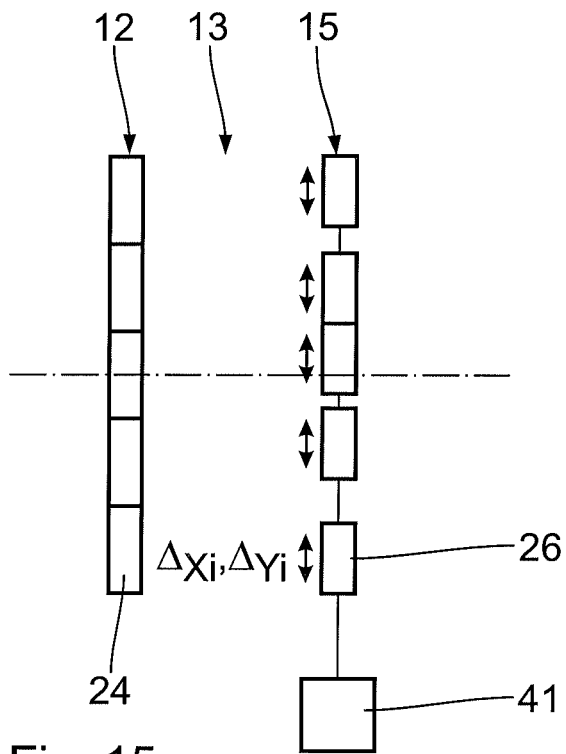
FIG. 15 is an illustration, similar to FIG. 12, of a raster module including two raster arrangements, with raster elements of one of the two raster arrangements again being individually displaceable relative to the other raster arrangements.

FIG. 15 is an illustration similar to FIG. 12 of another embodiment of a raster module 13 with different degrees of freedom for displacement between the two raster arrangements 12 and 15. Components which correspond to those which have already been explained above with reference to the embodiments described above and in particular with reference to the embodiment according to FIG. 12 are denoted by the same reference numerals and are not discussed in detail again.

A displacement device 41 for the raster elements 26 of the second raster arrangement 15 ensures an individual x, y displacement of the raster elements 26 along displacement paths $\Delta_{X1}, \Delta_{X2}, \ldots, \Delta_{XN}$ or $\Delta_{Y1}, \Delta_{Y2}, \ldots, \Delta_{YN}$, respectively. This x, y displacement results in a pupil-dependent displacement of the illumination channels which are displaced in the object field 3. This may be used for optimizing a superimposition of the illumination channels in the object field 3 and therefore for optimizing the intensity distribution across the object field 3. The x or y displacement $\Delta_{Xi}, \Delta_{Yi}$ results in a tilt dependence of the intensity distribution of the respective illumination channel of the displaced raster element 26, which has corresponding effects on the uniformity. This allows a tilt dependence of the telecentricity to be corrected.

The effects of an x displacement of raster areas of a first raster arrangement 12 will hereinafter be explained in more detail via FIGS. 16 to 18. Components or functions which correspond to those that have already been discussed above with reference to FIGS. 1 to 15 are denoted by the same reference numerals and are not explained in detail again.

Figure 16:
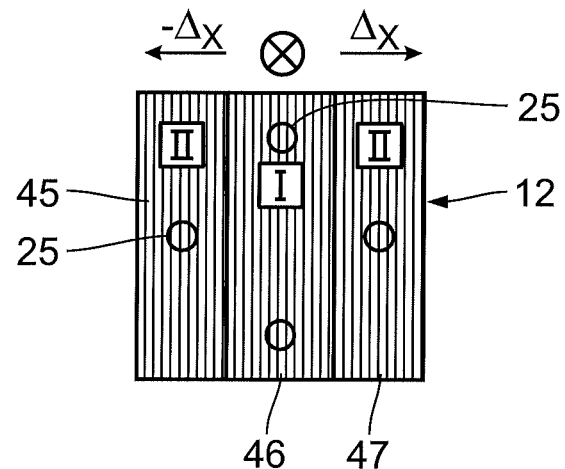
FIG. 16 is an illustration, similar to FIG. 3, of an embodiment of a raster arrangement including three raster areas which include in each case a plurality of raster columns consisting of raster elements, with the raster areas being displaceable relative to one another.

The first raster arrangement 12 according to FIG. 16 has three raster areas 45, 46, 47 which have different bundle-influencing effects, in other words they include raster elements 24 with different conical constants, for example, corresponding to the above description relating to the raster areas 27 to 31 of the first raster arrangement 12 according to FIG. 3.

Starting from a reference position of the three raster areas 45 to 47 relative to one another, the raster area 45 on the left-hand side of FIG. 16 is displaced to the left relative to the central raster area 46 by a path $-\Delta_X$ while the raster area 47 on the right-hand side of FIG. 16 is displaced to the right relative to the stationary central raster area 46 by a path $\Delta_X$.

Figure 17:
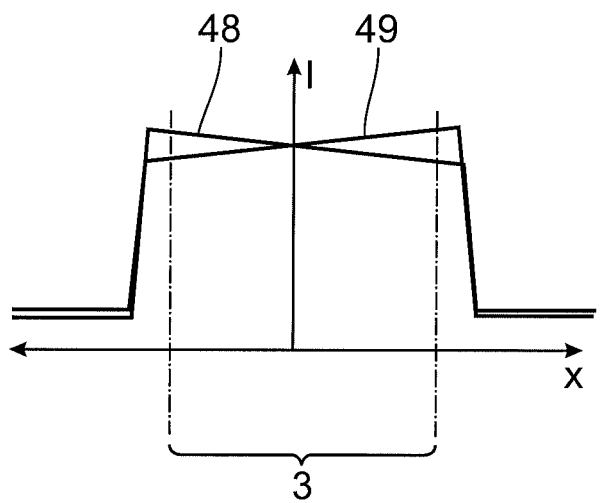
FIG. 17 is an illustration, similar to FIG. 4, of the effect on the intensity distribution across the illumination field when the raster areas of the raster arrangement according to FIG. 16 are displaced.

The two displacements $-\Delta_X$, $\Delta_X$ cause the intensity curve across the object field to change as shown in FIG. 17. Corresponding to FIG. 4, FIG. 17 shows an I(x) diagram of the scan-integrated intensity across the field height x. When the raster area 45 is displaced by the path $-\Delta_X$, this results in a tilted intensity curve 48 with a highest intensity at the left-hand edge of the object field 3 according to FIG. 17 and a lowest intensity at the right-hand edge of the object field 3 according to FIG. 17. Displacing the raster area 47 by the path $\Delta_X$ results in an intensity curve 49 with an opposite tilt, in other words with a lowest intensity at the left-hand field edge of FIG. 17 and a highest intensity at the right-hand field edge of FIG. 17.

Figure 18:
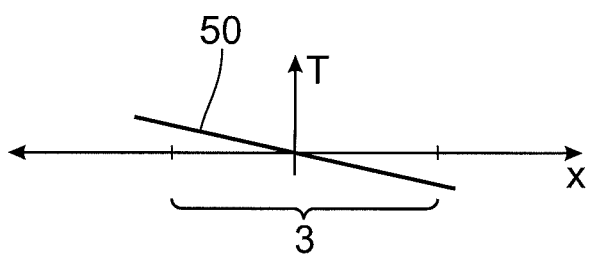
FIG. 18 shows the change of a telecentricity curve across the illumination field which is caused by the changing intensity distribution according to FIG. 17.

The tilted intensity curves 48, 49 result in a telecentricity curve 50 across the object field 3 as shown in FIG. 18. This is due to the fact that on the left-hand edge of the object field 3 according to FIG. 18, it is the intensity contribution from the raster area 47 that is most dominant while on the right-hand edge of the object field 3 according to FIG. 18, it is the intensity contribution from the raster area 45 that is most dominant.

Figure 19:
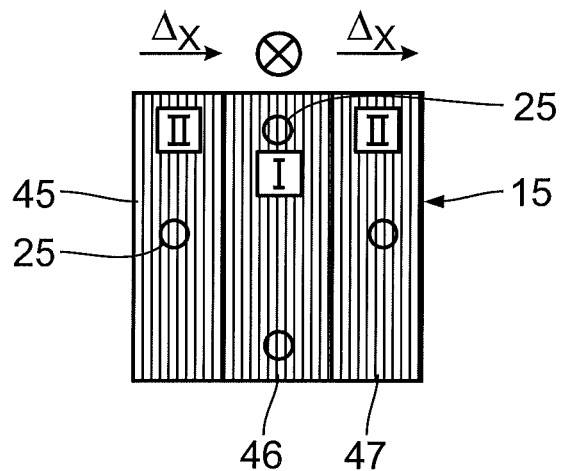
FIG. 19 is an illustration, similar to FIG. 16, of another embodiment of a raster arrangement including three raster areas which are displaceable relative to one another.
Figure 20:
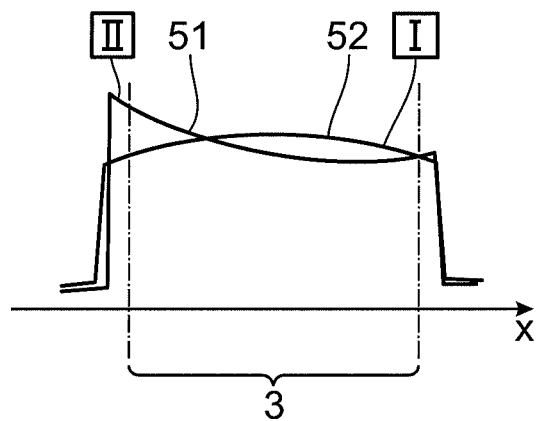
FIG. 20 shows, in an illustration similar to FIG. 17, the effects on the intensity distribution across the illumination field when the raster areas of the raster arrangement according to FIG. 19 are displaced relative to one another.
Figure 21:
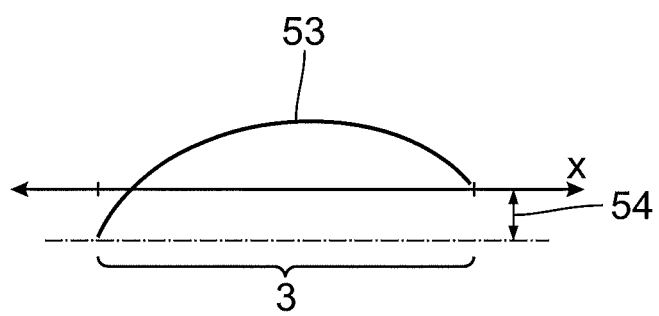
FIG. 21 shows the effects on an ellipticity curve across the illumination field which are caused by the changing intensity distribution according to FIG. 20.

The effect of a relative displacement of raster areas 45, 47 relative to the stationary central raster area 46 of the second raster arrangement 15 on particular illumination parameters of the illumination of the object field 3 is explained via FIGS. 19 to 21. Components which correspond to those that have already discussed above with reference to FIGS. 1 to 18 and in particular with reference to FIGS. 16 to 18 are denoted by the same reference numerals and are not described in detail again.

In contrast to FIG. 16 which shows the first raster arrangement 12, it is the second raster arrangement 15 which is shown in FIG. 19.

Starting from a reference position of the raster areas 45 to 47 relative to one another, a displacement according to FIG. 19 is performed in such a way that the raster area 45 is displaced to the right relative to the raster area 46 in FIG. 19 by a path $\Delta_X$ while the raster area 47 is displaced relative to the stationary central raster area 46 by a path $\Delta_X$ as well. The two outer raster areas 45, 47 are therefore both displaced relative to the central raster area 46 in the same direction, namely in the positive x-direction.

The central raster area 46 on the one hand and the two outer raster areas 45, 47 on the other are composed of raster elements having different bundle-guiding effects. The central raster area 46 includes raster elements of a first bundle-influencing type I, for example with a first conical constant. The two outer raster areas 45, 47 include raster elements 26 of a second type II having another bundle-influencing effect, in particular a conical constant which differs from that of type I.

The $\Delta_X$ displacements of the two outermost raster areas 45, 47 relative to the central raster area 46 result in a tilt of the field-dependent intensity distribution of type II which is such that the left field edge is impinged by a higher intensity than the right field edge (compare intensity curve 51 in FIG. 20). As the central raster area 46 is not displaced, the intensity curve 52 thereof remains unchanged across the object field 3.

The tilt of the intensity curve 51 results in a corresponding tilt of an ellipticity curve 53 which is shown in FIG. 21. The ellipticity curve 53 shown in FIG. 21 may be the curve of the ellipticity $E_{-45°/45°}$ or the curve of the ellipticity $E_{0°/90°}$. The tilt of the ellipticity curve 53 results in an ellipticity offset 54 on the right-hand side of the object field 3 according to FIG. 21.

Starting from a reference position, the displacement paths $\Delta_X$, $\Delta_Y$ for the raster arrangements 12, 15 or for the groups or areas of raster elements 24, 26 or for the individual raster elements 24, 26 may be in a range of between $-10\,\mu m$ and $+10\,\mu m$. Consequently, the absolute total displacement paths may amount to 20 μm. An absolute $\Delta_Z$ displacement path for the raster arrangements 12, 15 or for the groups or areas of raster elements 24, 26 or for the individual raster elements 24, 26 may amount to 30 μm.

The displacement in the z-direction is a displacement which is performed essentially along a beam direction of the illumination light. The x or y displacement is a displacement which is performed essentially transverse to the beam direction of the illumination light 8.

Alternatively, the displacement device 41 may be designed in such a way that one of the two raster arrangements 12, 15 is pivotable relative to the other one of the two raster arrangements 15, 12 about a pivot axis which is for example parallel to the x-axis or to the y-axis. In this case, the displacement device 41 is designed as a pivot drive for at least one of the two raster arrangements 12, 15.

Depending on the design of the raster module, the types of raster elements described above may be parts of the first raster arrangement 12 and/or parts of the second raster arrangement 15.

What is claimed is:

1. An illumination system configured to illuminate an object field with illumination light, the illumination system comprising:
    a first raster arrangement comprising a first plurality of bundle-forming raster elements arranged in or adjacent to a first plane of the illumination system, the first plurality of bundle-forming raster elements configured to generate a raster arrangement of secondary light sources;
    a transmission optics configured to superimpose transmission of the illumination light of the secondary light sources into the object field, the transmission optics comprising a second raster arrangement comprising a second plurality of bundle-forming raster elements;
    wherein:
        each bundle-forming raster element of the first plurality of bundle-forming raster elements is allocated to a corresponding bundle-forming raster element of the second plurality of bundle-forming raster elements to guide a partial bundle of an entire bundle of the illumination light;
        at least one of first and second raster arrangements comprises at least two types of bundle-forming raster elements which have different bundle-influencing effects;
        the bundle-forming raster elements of the first and second raster arrangements correspond to each other so that, for each bundle-forming raster element of one of the raster element types, there is an individual free distance between the bundle-forming raster element and its corresponding bundle-forming raster element of the other raster arrangement; and
        the illumination system is a microlithography illumination system.

2. The illumination system of claim 1, wherein at least one of the first and second raster arrangements comprises a distance step between a first raster area and a second area, the first area comprises a bundle-forming raster element of a bundle-forming first raster element type, and the second area comprises a bundle-forming raster element of a second bundle-forming raster element type.

3. The illumination system of claim 2, wherein at least one of the first and second raster areas comprises a plurality of raster elements of the same raster element type.

4. The illumination system of claim 2, wherein the at least one raster element having the distance step is thickness in its center, and the thickness of this raster element gradually decreases toward its edge.

5. The illumination system of claim 2, wherein the at least one raster element having the distance step is thinnest in its center, and the thickness of this raster element gradually increases toward its edge.

6. The illumination system of claim 1, wherein at least some of the raster element types are aspheric raster elements.

7. The illumination system of claim 6, wherein the raster element types have a different conical constant.

8. The illumination system of claim 1, wherein the raster arrangement comprises first and second types of raster elements which have different bundle-influencing effects, there is a distance step between a first raster area and a second raster area, the first raster area comprises a raster element of the first raster element type, and the second raster area comprises a raster element of the second raster element type.

9. The raster arrangement of claim 8, further comprising a displacement device to displace at least one displaceable segment of the raster arrangement.

10. A projection exposure apparatus, comprising:
    an illumination system according to claim 1,
    wherein the projection exposure apparatus is a microlithography projection exposure apparatus.

11. The projection exposure apparatus of claim 10, further comprising a projection objective.

12. A method, comprising:
- providing a projection exposure apparatus comprising a projection objective, a reticle and an illumination system according to claim 1; and
- using the projection exposure apparatus to project at least a part of the reticle onto a region of a photosensitive layer.

* * * * *

UNITED STATES PATENT AND TRADEMARK OFFICE
CERTIFICATE OF CORRECTION

PATENT NO.         : 8,873,023 B2
APPLICATION NO.    : 13/186068
DATED              : October 28, 2014
INVENTOR(S)        : Axel Scholz et al.

Page 1 of 1

It is certified that error appears in the above-identified patent and that said Letters Patent is hereby corrected as shown below:

IN THE CLAIMS:

Col. 20, line 61, claim 9, delete "The raster arrangement of" and insert -- The illumination system of --.

Signed and Sealed this
Third Day of March, 2015

Michelle K. Lee
*Deputy Director of the United States Patent and Trademark Office*